(12) United States Patent
Ancora et al.

(10) Patent No.: US 8,276,037 B2
(45) Date of Patent: Sep. 25, 2012

(54) TURBO DECODER WITH EXTRINSIC INFORMATION SCALING MODULES

(75) Inventors: Andrea Ancora, Nice (FR); Giuseppe Montalbano, Villeneuve (FR)

(73) Assignee: ST-Ericsson SA, Geneva (CH)

( * ) Notice: Subject to any disclaimer, the term of this patent is extended or adjusted under 35 U.S.C. 154(b) by 615 days.

(21) Appl. No.: 12/306,637

(22) PCT Filed: Jun. 14, 2007

(86) PCT No.: PCT/IB2007/052266
§ 371 (c)(1),
(2), (4) Date: Oct. 8, 2009

(87) PCT Pub. No.: WO2008/001251
PCT Pub. Date: Jan. 3, 2008

(65) Prior Publication Data
US 2010/0070826 A1   Mar. 18, 2010

(30) Foreign Application Priority Data
Jun. 27, 2006   (EP) .................................. 06300727

(51) Int. Cl.
*H03M 13/00* (2006.01)
(52) U.S. Cl. ....................................... 714/752; 714/755
(58) Field of Classification Search .................. 714/752, 714/755, 794
See application file for complete search history.

(56) References Cited

U.S. PATENT DOCUMENTS

| 6,393,076 B1 | 5/2002 | Dinc et al. |
| 2003/0088820 A1* | 5/2003 | Koppelaar ..................... 714/755 |
| 2004/0081259 A1 | 4/2004 | Ammer et al. |
| 2004/0225940 A1* | 11/2004 | Kerr et al. ..................... 714/752 |

OTHER PUBLICATIONS

Garrett D. et al., "Energy efficient Turbo Decoding for 3G Mobile", Proceedings of the 2001 International Symposium on Low Power Electronics and Design, Islped, Huntington Beach, CA, Aug. 6-7, 2001, International Symposium on Low Power Electronics and Design, New York, NY:ACM, US, pp. 328-333, XP002215915, ISBN: 1-58113-371-5.
Gracie K. et al., "Performance of an MLSE-based early stopping technique for turbo codes", Vehicular Technology Conference, 2004. VTC-2004-Fall. 2004 IEEE 60th Los Angeles, CA, USA Sep. 26-29, 2004.
Spasov D. et al., "A practical algorithm for turbo-decoding enhancement", Circuits and Systems, 2004. ISCAS '04. Proceedings of the 2004 International Symposium on Vancouver, BC, Canada May 23-26, 2004, Piscataway, NJ, USA, IEEE, US, May 23, 2004.
Vogt J. et al., "Improving the max-log-MAP turbo decoder", Electronics Letters, IEE Stevanage, GB, vol. 36, No. 23, Nov. 9, 2000.

(Continued)

*Primary Examiner* — Yolanda L Wilson
(74) *Attorney, Agent, or Firm* — William J. Kubida; Peter J. Meza; Hogan Lovells UP LLP

(57) ABSTRACT

The invention related to a turbo decoder comprising SISO decoding modules each other interconnected in a feedback control scheme having scaling modules for applying a scaling factor to extrinsic information delivered by said SISO decoding modules. The turbo decoder comprises a selection module for adaptively selecting said scaling factor based on a number of decoding iterations of the turbo decoder.

18 Claims, 3 Drawing Sheets

OTHER PUBLICATIONS

Giulietti A et al., "A 80 Mb/s low-power scalable turbo codec core", Proceedings of the 33rd Annual ACM Symposium on Theory of Computing, Hersonissos, Crete, Greece, Jul. 6-8, 2001, Proceedings of the Annual ACM Symposium on Theory of Computing, New York, NY: ACM, US, May 12, 2002.

Bauch G. et al., "A comparison of soft-in/soft-out algorithms for turbo-detection", ICT. International Conference on Telecommunications. Bridging East and West Through Telecommunications, vol. 2. Jun. 21, 1998.

Mani Vaya and Nasir Ahmed, "Turbo Decoding on C6211 DSP" [online], Dec. 8, 2001.

Nordman R., "Application of the Berrou Soya algorithm in decoding of a turbo code", European Transactions on Telecommunications, Wiley & Sons, Chichester, GB, vol. 14, No. 3, May 2003.

PCT International Search Report, PCT/IB2007/052266, mailing date Apr. 15, 2008.

* cited by examiner

TURBO DECODER WITH EXTRINSIC INFORMATION SCALING MODULES

CROSS-REFERENCE TO RELATED APPLICATIONS

The present application is a national filing in the U.S. Patent & Trademark Office of PCT/IB2007/052266 filed Jun. 14, 2007, and claims priority of EPO Patent Application No. 06300727.2 filed Jun. 27, 2006, both of which applications are incorporated herein in their entireties by this reference.

The present invention relates to turbo decoders, more specifically to a turbo decoder implementing iterative control algorithm for suppressing transients.

Turbo encoding/decoding techniques are nowadays widely used in the field of telecommunication, including GSM communication, communication with spatial probes, and so on.

Several turbo decoding techniques have been designed, one of them being the so-called "next iteration initialization turbo decoding technique" which uses an control algorithm for enhancing the transient behavior of the turbo decoding. Such technique is described by D. Spasov et al. in "A practical algorithm for Turbo decoding enhancement", proceedings of the 2004 IEEE International Symposium on Circuits and Systems, vol. IV, pp. 621-624, 2004, ISBN 0-7803-8251-X.

The turbo decoder described in this paper comprises two usual interconnected SISO (Soft Input Soft Output) decoding modules implementing a log-map or max-log-map algorithm. Each decoding modules is included in an feedback control loop provided for the other module, this loop being designed to suppress transient chaos appearing in the so-called "waterfall region".

The feedback control loop comprises a scaling module connected to each decoding module and applying a scaling factor to extrinsic information received from it. In Spasov's paper, the scaling factor depends on some characteristics of the extrinsic information, e.g. on some constant parameters as well as on an exponential of the absolute value of the extrinsic information. The computation of the scaling factor thus adds complexity to the overall system and is time consuming.

The present invention aims at solving the aforementioned problem and provides a turbo decoder comprising at least two SISO decoding modules each other interconnected in a feedback control scheme having scaling modules for applying a scaling factor to extrinsic information delivered by said SISO decoding modules, wherein it comprises a selection module for selecting said scaling factor based on a number of decoding iterations of the turbo decoder.

According specific embodiments of the invention:
said selection module implements a decreasing function of said number of decoding iterations for selecting said scaling factor;
said selection module implements a linear function;
said scaling factor is comprised between 0.5 and 1.0; and
the scaling factor is selected amongst a set of pre-computed values.

The invention also provides a turbo decoding method for decoding turbo codewords, comprising at least two SISO decoding steps interrelated in a feedback control scheme and a scaling step for applying a scaling factor to extrinsic information computed during said at least two decoding steps, wherein it comprises a selection step for adaptively selecting said scaling factor based on a number of decoding iterations of the turbo decoding method.

The invention, as well as advantages thereof, will be better understood when reading the following description, given by way of example and in connection with accompanying drawing in which.

Figure 1:
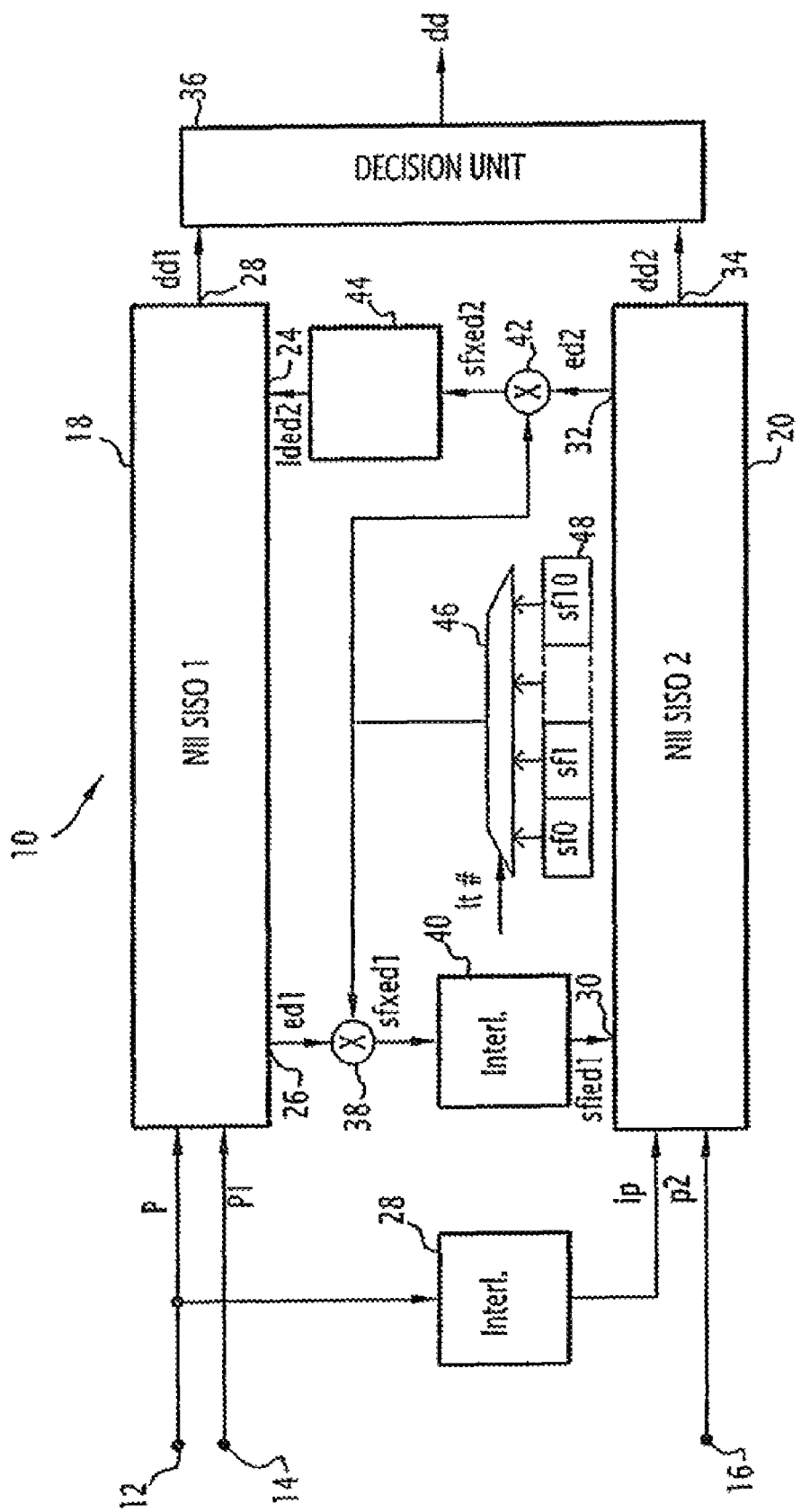
FIG. 1 is a schematic diagram of a turbo decoder according the invention.

A turbo decoder 10 of the invention is schematically represented at FIG. 1.

The turbo decoder 10 receives turbo codewords (p, p1, P2) at input terminals 12, 14, 16 respectively, the turbo codewords being transmitted to turbo decoder 10 over AWGN (additive white Gaussian noise) binary input memoryless channel (non represented), using BPSK (binary phase shift keying) modulation. A turbo codeword is composed of first block of payload data p, a second block of n/2 parity binary bits p1 for the payload data computed using convolution code and third block of n/2 parity binary bits p2 for a known permutation of the payload data, as it is well known in the art. The bit length of a turbo codeword is thus equal to 3n, with e.g. n=1000.

The turbo decoder 10 comprises a first and second conventional SISO decoders 18, 20.

The first decoder 18 is connected to input terminals 12, 14 for receiving the payload data p and the n/2 parity binary bits p1. The first decoder 18 also receives at input terminal 22 scaled de-interleaved extrinsic information data sded2 from the second decoder 20, as it will be described in greater details hereafter, and provides at an output terminals 26, 28 extrinsic information data ed1 and decoded data dd1 respectively.

Likewise, the second convention SISO decoder 20 is connected to input terminal 12 through a first interleaver 28 and to the input terminal 16 for receiving interleaved payload data ip and the n/2 parity bits p2. The second decoder 20 also receives at input terminal 30 scaled interleaved extrinsic information data sied1 from the first decoder 18, as it will be described in greater details hereafter, and provides at an output terminals 32, 34 extrinsic information data ed2 and decoded data dd2 respectively. The first and second decoders 18, 20 implements an iterative Log-Map or Max-Log-Map algorithm, e.g. those described in the aforementioned Spasov's paper.

The turbo decoder 10 also comprises a decision unit 36 connected to output terminals 28, 34 for receiving decoded data dd1, dd2 from the first and second decoders 18, 20 and determining in function thereof the final decoded data dd, as it is well known in the art.

The first and second SISO decoders 18, 20 are interconnected in a feedback control loop scheme, one decoder being included in a feedback control loop for the other decoder.

In that way, a feedback control loop for the first decoder 18 comprises a first multiplier 38 connected at an input thereof to extrinsic information data output terminal 24 of the first decoder 18, a second interleaver 40 connected at an input thereof to an output of multiplier 38, the second decoder 20 connected at its input terminal 30 to the output of the interleaver 40, a second multiplier 42 connected at an input thereof to extrinsic information data output terminal 32 of the second decoder 20, a de-interleaver 44 connected at an input thereof to an output of second multiplier 42. Finally, an output of the de-interleaver 44 is connected to the scaled de-interleaved extrinsic information data input terminal 24 of the first decoder 18, thus ending the feedback control loop for the first decoder 18.

Likewise, a feedback control loop for the second decoder 20 is composed of the second multiplier 42, the de-interleaver 44, the first decoder 18, the first multiplier 38 and the second interleaver 40.

The first and second multipliers 38, 42 multiply the extrinsic information data they receive by a scaling factor sf whose value is selected by a selection module 46 amongst a pre-computed set {sf1, sf2, . . . , sf10} of scaling factor values initially stored in a look-up table 48.

The selection module 46 selects a decreasing scaling factor value sf as the number of iterations of the decoding algorithm implemented by the decoders 18, 20 is rising, thereby making the first and second decoders 18, 20 more and more independent while said decoding algorithm is converging.

Figure 2:
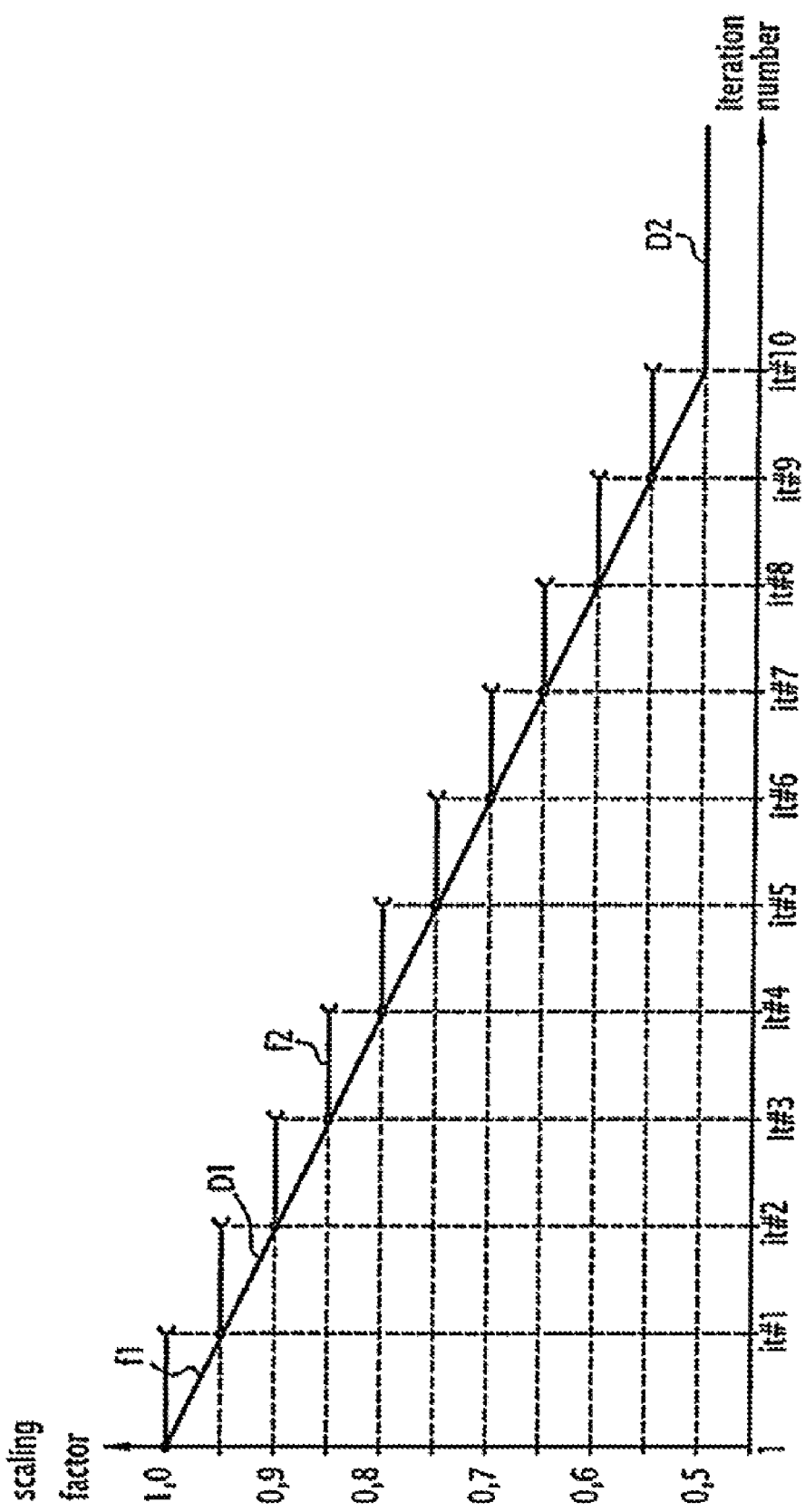
FIG. 2 illustrates a law of selection of scaling factor value in function of iteration number used by a selection module of FIG. 1.

Examples of selection functions implemented by the selection module 46 are illustrated in FIG. 2 which is plots of selected scaling factor value in function of the number of iterations.

In a first embodiment, the selection module 46 implements a selection of decreasing scaling factor values comprised between 0.5 and 1.0 based on a decreasing function f1 comprising a first portion D1, which is a strictly decreasing linear function between the first iteration of the decoding algorithm and a preset number of iterations it#10, and a second portion D2, which is a constant function for number of iterations greater than it#10.

In a second embodiment, the selection module 46 implements a selection of decreasing scaling factor values comprised between 0.5 and 1.0 based on a decreasing function f2 which is an approximation of function f1. In this embodiment, the interval [0.5;1.0] of scaling factor values is sampled in 11 values 0.5+i*0.05, where i=0, 1, 2, . . . , 10. Likewise, the interval [1; it#10] of numbers of iterations is sampled in 11 values 1+i*(it#10−1)/10. The selection modules 46 thus selects the scaling factor value 0.5 +i*0.05 if the number of iterations is comprised between interval [1+i*(it#10−1)/10; 1+(i+1)*(it#10−1)/10] for any i<10 and 1.0 for the scaling factor it the number of iterations is greater than it#10.

Other selections for the scaling factor are possible, e.g. selection based on function starting from a scaling factor equal to 1.0 and converging to a scaling factor equal to 0.5 as the number of iteration is rising.

Figure 3:
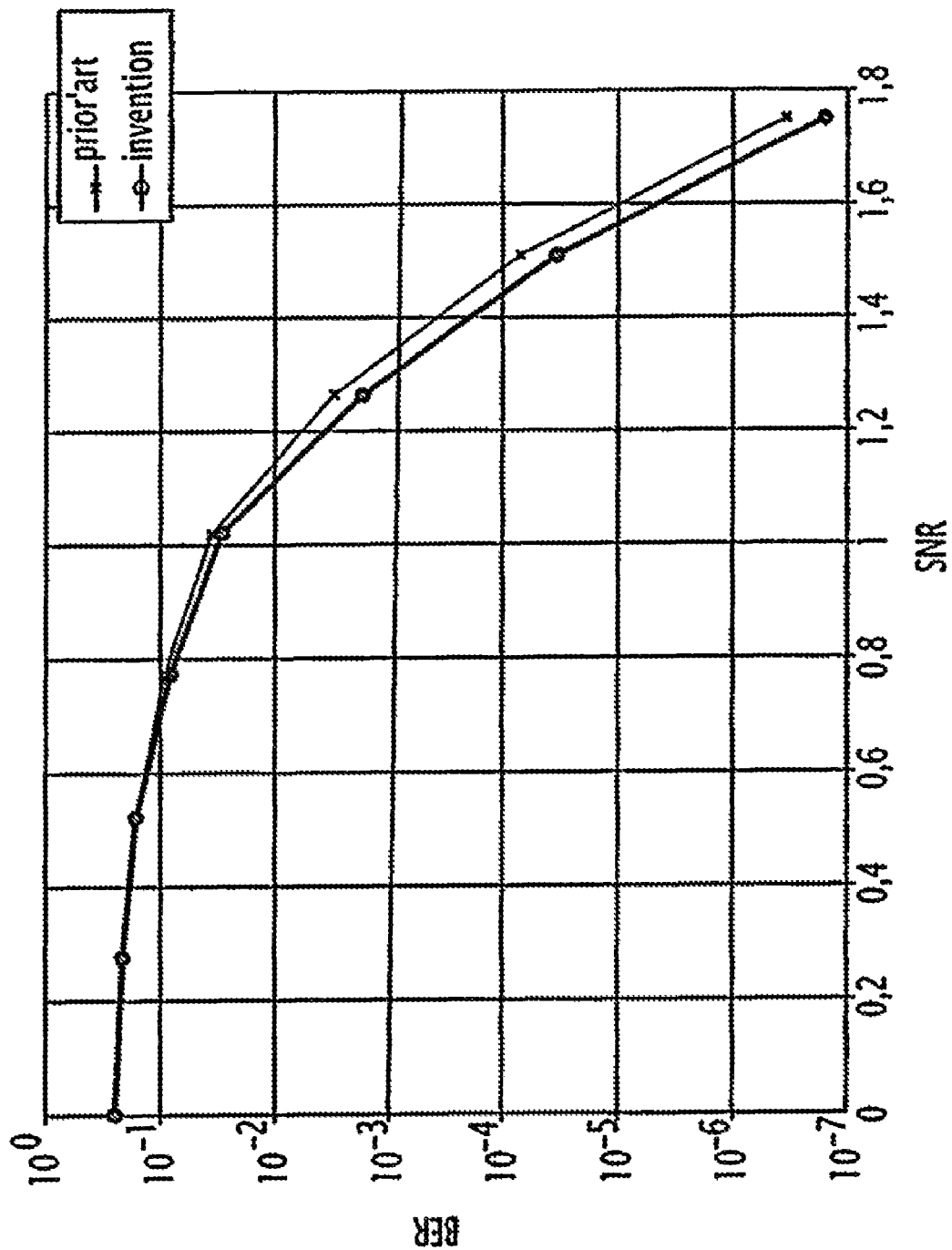
FIG. 3 is plots of bit error rate vs. signal/noise ratio of a turbo decoder of the prior art and a turbo decoder according the invention.

FIG. 3 illustrates the gain obtained by the turbo decoder of the invention compared to the turbo decoder described in Spasov's paper. FIG. 3 plots the bit error rate (BER) vs. the signal/noise ratio (SNR) obtained by theses turbo-decoders. As one can see, by means of an adaptative scaling factor based on the number of decoding iterations, the BER of the turbo-decoder of the invention is lower than the one obtained by the prior art, especially when the SNR is high.

From reading the present disclosure, other variations and modifications will be apparent to the skilled person. Such variations and modifications may involve equivalent and other features which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A turbo decoder having a hardware portion comprising SISO decoding modules interconnected in a feedback control scheme having scaling modules for applying a scaling factor to extrinsic information delivered by said SISO decoding modules, and a selection module for adaptively selecting said scaling factor based on a number of decoding iterations of the turbo decoder;
   wherein said selection module implements a decreasing function of said number of decoding iterations for selecting said scaling factor.

2. The turbo decoder of claim 1, wherein said selection module implements a linear function.

3. The turbo decoder of claim 1, wherein said scaling factor is between 0.5 and 1.0.

4. A turbo decoder of claim 1, wherein the scaling factor is selected amongst a set of pre-computed values.

5. A turbo decoding method for decoding turbo codewords, comprising at least two SISO decoding steps interrelated in a feedback control scheme and a scaling step for applying a scaling factor to extrinsic information computed during said at least two decoding steps, and a selection step for adaptively selecting said scaling factor based on a number of decoding iterations of the turbo decoding method;
   wherein said selection step comprises a decreasing function of said number Of decoding iterations for selecting said scaling factor.

6. The method of claim 5, wherein said selection step comprises a linear function.

7. The method of claim 5, wherein said scaling factor is between 0.5 and 1.0.

8. The method of claim 5, wherein the scaling factor is selected amongst a set of pre-computed values.

9. A turbo decoder having a hardware portion comprising:
   a first decoder having first and second inputs, an extrinsic input, an extrinsic output, and a decoded data output;
   a second decoder having first and second inputs, an extrinsic input, an extrinsic output, and a decoded data output;
   a first interleaver coupled between the first input of the first decoder and the first input of the second decoder;
   a second interleaver having an input and an output coupled to the extrinsic input of the second decoder;
   a first multiplier having a first input coupled to the extrinsic output of the first decoder, a second input for receiving a scale factor, and an output coupled to the input of the second interleaver;
   a second multiplier having a first input coupled to the extrinsic output of the second decoder, a second input for receiving the scale factor, and an output; and a de-interleaver having an input coupled to the output of the second multiplier, and an output coupled to the extrinsic input of the first decoder.

a selection module for adaptively selecting said scaling factor based on a number of decoding iterations of the turbo decoder, wherein said selection module implements a decreasing function of said number of decoding iterations for selecting said scaling factor.

10. The turbo decoder of claim 9 further comprising a decision unit having a first input coupled to the decoded data output of the first decoder, a second input coupled to the decoded data output of the second decoder, and an output for supply a turbo decoder decoded data output.

11. The turbo decoder of claim 9 wherein the first decoder comprises a SISO decoder.

12. The turbo decoder of claim 9 wherein the second decoder comprises a SISO decoder.

13. The turbo decoder of claim 9 wherein the first input of the first decoder receives payload information.

14. The turbo decoder of claim 9 wherein the second input of the first decoder receives parity information.

15. The turbo decoder of the claim 9 wherein the second input of the second decoder receives parity information.

16. The turbo decoder of claim 9 further comprising a lookup table for supplying the scale factor from a pre-computed set of scaling factors.

17. The turbo decoder of claim 16 further comprising a multiplexer coupled to the lookup table, the output of the multiplexer supplying a selected scale factor.

18. The turbo decoder of claim 17 wherein the multiplexer receives an iteration control signal.

* * * * *

UNITED STATES PATENT AND TRADEMARK OFFICE
CERTIFICATE OF CORRECTION

| | | |
|---|---|---|
| PATENT NO. | : 8,276,037 B2 | Page 1 of 1 |
| APPLICATION NO. | : 12/306637 | |
| DATED | : September 25, 2012 | |
| INVENTOR(S) | : Andrea Ancora and Giuseppe Montalbano | |

It is certified that error appears in the above-identified patent and that said Letters Patent is hereby corrected as shown below:

Column 4, line 44, "Of" should be --of--

Column 4, line 67, delete second occurrence of "and"

Column 5, line 3, "." should be --; and--

Signed and Sealed this
First Day of January, 2013

David J. Kappos
*Director of the United States Patent and Trademark Office*